US005777384A

United States Patent [19]
Root et al.

[11] Patent Number: 5,777,384
[45] Date of Patent: Jul. 7, 1998

[54] TUNABLE SEMICONDUCTOR DEVICE

[75] Inventors: Loren F. Root, McHenry; Kevin J. McDunn, Lake in the Hills, both of Ill.

[73] Assignee: Motorola, Inc., Schaumburg, Ill.

[21] Appl. No.: 729,130

[22] Filed: Oct. 11, 1996

[51] Int. Cl.$^6$ .................. H01L 23/473; H01L 23/433
[52] U.S. Cl. .................. 257/712; 257/714; 257/715; 257/691; 257/719; 361/690; 361/707; 361/713; 174/252; 174/255
[58] Field of Search .................. 257/712, 714, 257/719, 723, 691, 706, 724; 361/707, 690, 713; 174/252, 255

[56] References Cited

U.S. PATENT DOCUMENTS

| | | | |
|---|---|---|---|
| 4,032,949 | 6/1977 | Bierig | 257/529 |
| 4,458,295 | 7/1984 | Durschlag et al. | 257/532 |
| 4,639,760 | 1/1987 | Granberg et al. | 257/705 |
| 5,220,804 | 6/1993 | Tilton et al. | 62/64 |
| 5,287,001 | 2/1994 | Buchmann et al. | 257/719 |
| 5,291,065 | 3/1994 | Arai et al. | 257/723 |
| 5,514,906 | 5/1996 | Love et al. | 257/712 |
| 5,525,834 | 6/1996 | Fischer et al. | 257/691 |
| 5,552,634 | 9/1996 | Schneider | 257/706 |
| 5,600,187 | 2/1997 | El-Homamsy et al. | 257/296 |
| 5,606,202 | 2/1997 | Lutz | 257/714 |

FOREIGN PATENT DOCUMENTS

| | | | |
|---|---|---|---|
| 480750 | 4/1992 | European Pat. Off. | 257/714 |
| 516478 | 12/1992 | European Pat. Off. | 257/714 |
| 4220732 | 1/1993 | Germany | 257/714 |
| 3-236268 | 10/1991 | Japan | 257/714 |
| 4-28257 | 1/1992 | Japan | 257/714 |
| 4-147656 | 5/1992 | Japan | 257/714 |
| 4-239162 | 8/1992 | Japan | 257/714 |
| 4-256349 | 9/1992 | Japan | 257/714 |
| 4-369255 | 12/1992 | Japan | 257/714 |
| 5-67712 | 3/1993 | Japan | 257/714 |
| 5-121608 | 5/1993 | Japan | 257/714 |

*Primary Examiner*—Tom Thomas
*Assistant Examiner*—Alexander Oscar Williams
*Attorney, Agent, or Firm*—Heather L. Creps

[57] ABSTRACT

The device includes a substrate (18). A first semiconductor die (12) is disposed on the substrate (18). The first semiconductor die (12) has a major surface (23) and at least a portion of the major surface (23) is positioned to receive a cooling medium. A signal input region (24), an active region (32) and a conductive region (34) are disposed on the major surface (23). The conductive region (34) is coplanar with, and electrically couples, the signal input region (24) and the active region (32). An electrically reactive metal region (42) is in communication with the signal input region (24). The electrically reactive metal region (42) is sized to allow real-time iterative tuning of the electronic device.

15 Claims, 4 Drawing Sheets

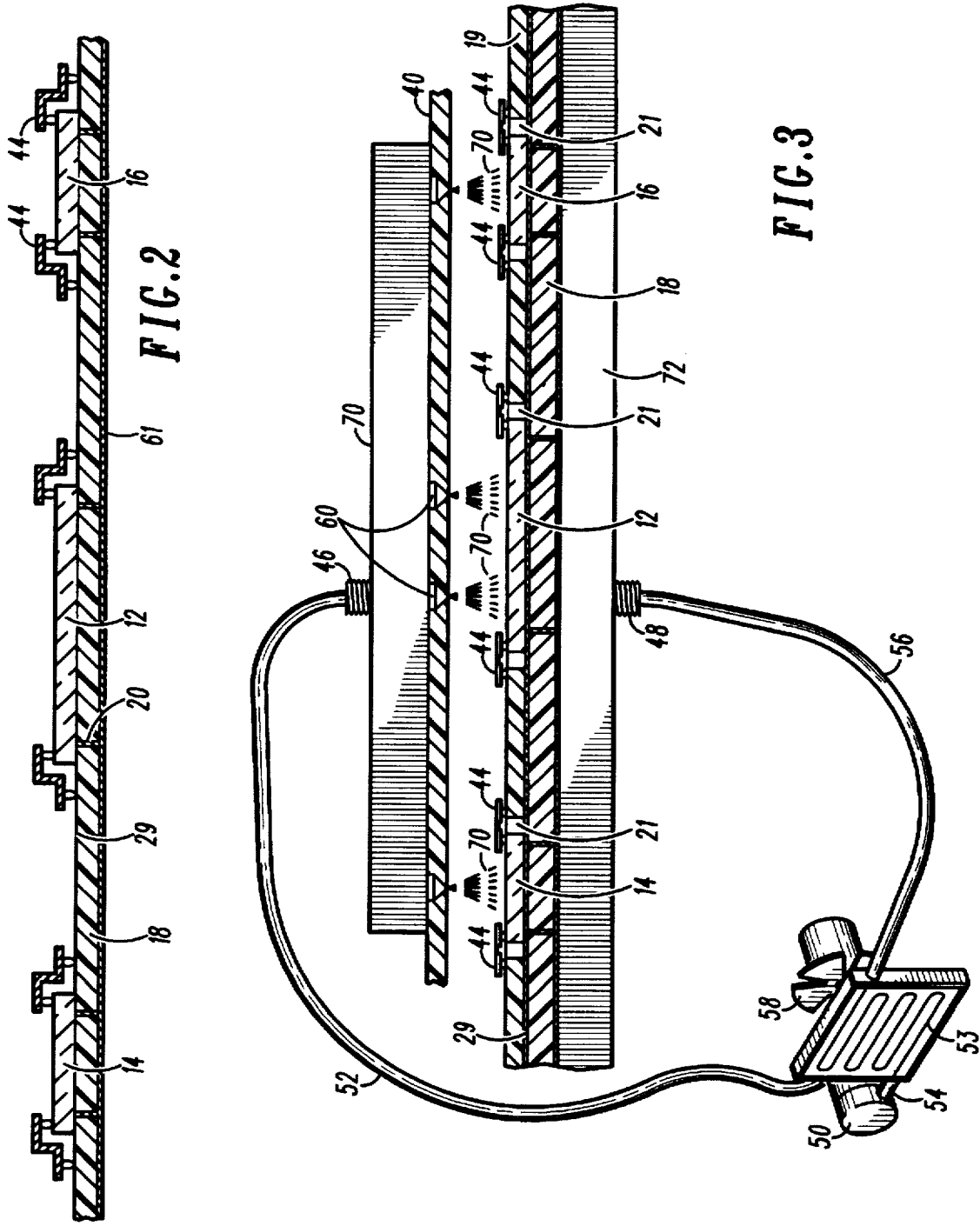

5,777,384

TUNABLE SEMICONDUCTOR DEVICE

FIELD OF THE INVENTION

This invention relates generally to electronics, and, more particularly, to an electronic device and a method for spray-cooling an electronic device.

BACKGROUND OF THE INVENTION

Often, electronic devices are cooled by natural or forced air convection which, because of the relatively poor thermal capacitance and heat transfer coefficients of air, requires moving large volumes of air past the devices or past heavy heat sinks attached to the devices. When large heat sinks are utilized, the overall weight and size of electronic equipment may be increased.

Evaporative spray cooling features the spraying of atomized fluid droplets directly onto a surface of a heat source such as an electronic device. When the fluid droplets impinge upon the device's surface, a thin film of liquid coats the device, and heat is removed primarily by evaporation of the fluid from the device's surface.

Although evaporative spray cooling is a preferred method of heat removal in many electronics applications, spray-cooling some electronic devices may not be desirable or practical. For example, the wire interconnects of typical high-power microwave and radio frequency transistors which are utilized to form highly critical inductive portions of frequency dependent impedance matching structures essential to optimal device performance as well as interconnection between various other semiconductor dice, metal oxide semiconductor capacitors, package features such as leads, and other components associated with the transistors present significant practical application, performance, assembly handling, and manufacturing liabilities when associated with the implementation of spray cooling technology.

Wires are fragile. In applications such as microwave and radio frequency power transistors where minor perturbation of the wire structure will result in device failure either through detuning of the matching structure or physical shorting of the wires together, the wires may not tolerate being sprayed by a fluid. Microwave and radio frequency transistors and assembly modules with chip and wire matching are also extremely sensitive to variations in shape and spatial positioning of the wires. Misalignment and bending of the wires may adversely affect device tuning thereby altering device performance. In addition, wires are often protected from physical damage by a device cap. The device cap, however, may preclude effective spray-cooling of the transistor because it does not allow for the spraying of fluid directly onto the surface of semiconductor dice.

Moreover, wire-bonded wires may preclude automated iterative tuning of an electronic device, which is desirable to minimize performance variation and improve product yield.

There is therefore a need for an electronic device which tolerates direct spraying of a semiconductor die within the device, which eliminates the need for wire bonding, and which may be iteratively tuned during operation of the device to reduce performance variation.

SUMMARY OF THE INVENTION

According to an aspect of the present invention, the foregoing needs are addressed by an electronic device which includes a substrate. A first semiconductor die is disposed on the substrate. The first semiconductor die has a major surface and at least a portion of the major surface is positioned to receive a cooling medium. A signal input region, an active region and a conductive region are disposed on the major surface. The conductive region with, and electrically couples, the signal input region and the active region. An electrically reactive metal region is in communication with the signal input region. The electrically reactive metal region is sized to allow real-time iterative tuning of the electronic device.

According to another aspect of the present invention, an electronic device includes a first substrate layer having a first top side and a first bottom side. A first radio frequency component is disposed on the first top side. The first radio frequency component has a first major surface. A first signal input region and a first active region are disposed on the first major surface. A second substrate layer has a second top side and a second bottom side, and at least a portion of the first radio frequency component is coupled to the second bottom side. The second bottom side has a first fluid distributing channel disposed therein. The first fluid distributing channel is in communication with at least a portion of the first major surface. A first inductive metal region is disposed on the second top side. The first inductive metal region is in communication with the first signal input region. The first inductive metal region is sized to allow real-time iterative tuning of the first radio frequency component.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 2 is a front view along line 2—2 of the electronic device shown in FIG. 1, mounted to a substrate in accordance with one embodiment of the present invention.

FIG. 3 is a front view of the electronic device depicted in FIGS. 1 and 2, mounted to a substrate in accordance with another embodiment of the present invention, further depicting a spray-cooling system having a closed-loop fluid flow.

DETAILED DESCRIPTION OF THE PREFERRED EMBODIMENTS

Figure 1:
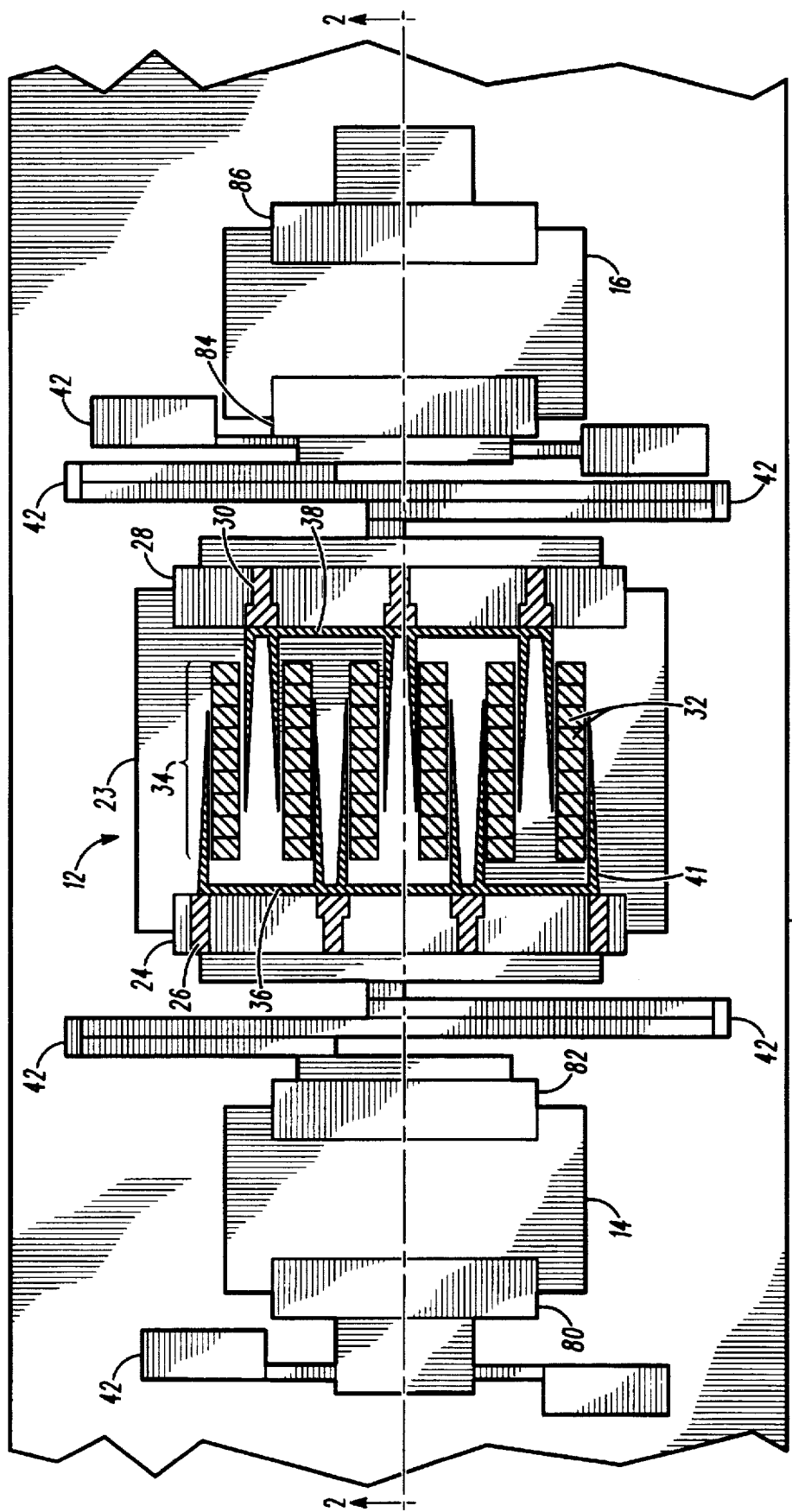
FIG. 1 is a top view of an electronic device according to one embodiment of the present invention.

Turning now to the drawings, wherein like numerals designate like components, FIG. 1 is a top view of an electronic device 10 according to one embodiment of the present invention. As shown, electronic device 10 is a laterally-diffused metal oxide semiconductor radio frequency power transistor. It is contemplated, however, that electronic device 10 may be another type of device, such as a an integrated circuit or a bipolar or field effect transistor. Device 10 includes a transistor semiconductor die 12 and matching metal oxide semiconductor (MOS) capacitor semiconductor dice 14, 16, disposed on a substrate 18. Substrate 18 may be ceramic or another suitable material. Transistor semiconductor die 12 is referred to herein as transistor 12, capacitor semiconductor die 14 is referred to as input capacitor 14 and capacitor semiconductor die 16 is referred to as output capacitor 16. In addition, electronic device 10 may be configured in a variety of ways, for example, vertically integrated.

Transistor 12 has a major surface 23. An input region 24, which is preferably a metallized polyamide, having a number of input device contacts 26 associated therewith, is disposed on major surface 23. An output region 28, which is preferably a metallized polyamide, having a number of output device contacts 30 associated therewith, is also disposed on major surface 23. Device contacts 26, 30, which are preferably disposed on die 12, may be a metal such as aluminum or gold with a suitable solder overcoat, may be soldered or otherwise secured to input region 24 and output region 28, respectively.

Active regions 32 of transistor die 12, which may include a number of cells, each cell including arrays of transistors such as laterally-diffused metal oxide semiconductor (LDMOS) transistors, are electrically coupled to input region 24 (via input device contacts 26) and output device region 28 (via output device contacts 30) by conductive region 34, which is co-planar with input region 24 and output region 28. Active region 32 may be ballasted with resistive elements, for example, to balance a flow of current through each of the active cells associated with active region 32. Ballasting regions may be implanted in die 12 via an ion implantation process according to well-known methods, may be diffused into die 12 or alternatively may be deposited onto die 12 using vapor deposition, for example.

Conductive region 34 includes an input edge contact 36 and an output edge contact 38, and also includes active region contacts 41, or feed structures. Faraday shielding structures (not shown) may be used in conjunction with conductive regions 34 to mitigate capacitance effects. It is also contemplated that active region contacts 41 may connect to conductive regions 34 from the center of die 12.

Like transistor 12, input capacitor 14 has an input region 80 and an output region 82. Output capacitor 16, which is optional, also has an input region 84 and an output region 86. Input regions 80,82 and output regions 84, 86 are preferably composed of a metal such as gold.

Electrically reactive metal regions 42, such as inductive metal regions, which may be copper or another suitable metal, are disposed on substrate 18 and are in communication with input region 24 and output region 28 of transistor 12 and with input regions 80, 84 of input and output capacitors 14, 16, respectively. Inductive metal regions 42 are sized to allow real-time iterative tuning of transistor device 10. For example, inductive metal regions 42 may be etched in a well-known manner using a laser.

FIG. 2 is a front view along line 2—2 of the electronic device shown in FIG. 1, mounted to substrate 18 in accordance with one embodiment of the present invention. Transistor 12 is tied to ground layer 61 via a grounded die bond pad 29 and an array of vias 20. Flex circuit interconnects 44, which may be made of a metallized polyimide material or another suitable material, are positioned over input device contacts 26 or over output device contacts 30 of transistor 12, or over input regions 80, 84 or output regions 82, 86 of capacitors 14, 16, respectively, and are also in contact with substrate 18. Flex circuit interconnects 44 may be secured to substrate 18 using a well-known method such as a solder bump reflow process.

Interconnects 44 are preferably compliant to absorb strain introduced by differing coefficients of thermal expansion of dice 12, 14 and 16 and substrate 18, which is preferably ceramic but may be another suitable material such as glass-filled epoxy, teflon or plastic. Suitable interconnects 44 are commonly available from a variety of sources. As shown in FIG. 2, interconnects 44 are "S"-shaped to accommodate the height difference between dice 12, 14 and 16 and substrate 18.

FIG. 3 is a front view of electronic device 10, mounted to substrate 18 in accordance with another embodiment of the present invention. As shown, an additional substrate layer 19, made of ceramic or another suitable material, is in communication with substrate 18, having cavities 21 therein. Dice 12, 14 and 16 are disposed within cavities 21. Interconnects 44, which are preferably flat, secure dice 12, 14 and 16 to substrate 19. A ground metal layer 61 may be disposed between substrate 19 and substrate 18.

FIG. 3 further depicts a spray-cooling system having a closed-loop fluid flow, suitable for use with electronic device 10. One or more nozzles 60 are preferably disposed in nozzle housing 40, which may be any geometrical shape such as rectangular or cylindrical, and is preferably metal, but may be constructed from another material such as plastic. Two nozzles may positioned over transistor 12, while a single nozzle may be disposed over each capacitor 14, 16.

Nozzles 60 are preferably miniature atomizers such as simplex pressure-swirl atomizers, and may be made of any suitable material. An example of a suitable material is a metal such as stainless steel or brass. Simplex pressure-swirl atomizers are described in detail in U.S. Pat. No. 5,220,804 to Tilton et al., incorporated herein by reference, and are commercially available from Isothermal Systems Research, Inc., located in Colton, Wash.

A fluid pump 50, which is connected via tube 52 to fluid inlet port 46, supplies a coolant fluid to a fluid supply manifold 70, suitable fluid supply manifolds being well-known, which may be used to deliver the fluid to nozzles 60. Nozzles 60 atomize the coolant and discharge an atomized fluid 70 directly onto dice 12, 14 and 16. When atomized fluid 70 impinges upon the surfaces of dice 12, 14 and 16, a thin liquid film coats the dice, and heat is removed primarily by evaporation of fluid 70 from the dice. Excess fluid may be collected and removed by fluid return manifold 72 and outlet port 48.

The coolant fluid may be any dielectric coolant, such coolants being well-known and widely available. One example of a suitable coolant is 3M's Fluorinert™ dielectric fluid, available from 3M, order number FC-72. Another perfluorocarbon fluid similar to 3M's Fluorinert™ dielectric fluid is available from Ausimont Galden®.

A condenser 53, connected to pump 50 by tube 54 and to fluid outlet port 48 by tube 56, receives fluid from fluid outlet port 48. Condenser 53 rejects heat from the fluid, returning it to primarily a liquid phase. Fan 58 may be used to extend the cooling capacity of condenser 53. Cooled fluid is supplied from condenser 53 to pump 50. Thus, a closed-loop flow of coolant is formed. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one housing 40 may be connected to a single source of coolant or that one or more sources of coolant may be connected to a single housing 40, for example, for redundancy purposes.

Sizes of fluid pump 50, condenser 53 and fan 58 should be selected based on heat removal and flow rate requirements. For example, a typical closed-loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

An electronic device or a group of electronic devices having a power density of up to 300 Watts per square centimeter is effectively cooled using the disclosed apparatus. The removal of heat directly from individual dice, or from groups of dice, rather than from a protective die shield or heat sink, helps to reduce operating temperatures of the dice, increasing reliability through reduction of thermal variation and associated thermal stresses.

Housing 40 may be placed extremely close to the surface of electronic device 10 because spacing is not governed by air volume requirements. Thus, packaging size for the electronic device may be reduced. In addition, unlike air cooling, which is most effective when heat is spread over a large area, for example, over a large heat sink, spray-cooling encourages heat concentration, another factor contributing to reduced packaging volume and weight.

Furthermore, electronic device 10 described herein eliminates the need for fragile wire bond wires completely and replaces them with a robust alternative. The replacement of wire bond wires with fixed-position contact structures such as flexible interconnects allows for automated iterative tuning, minimizes performance variation and improves product yield. Thus, embodiments of the present invention are desirable for cooling an electronic component during the testing and tuning process—the electronic module may be tested, laser-tuned and spray-cooled simultaneously.

Figure 4:
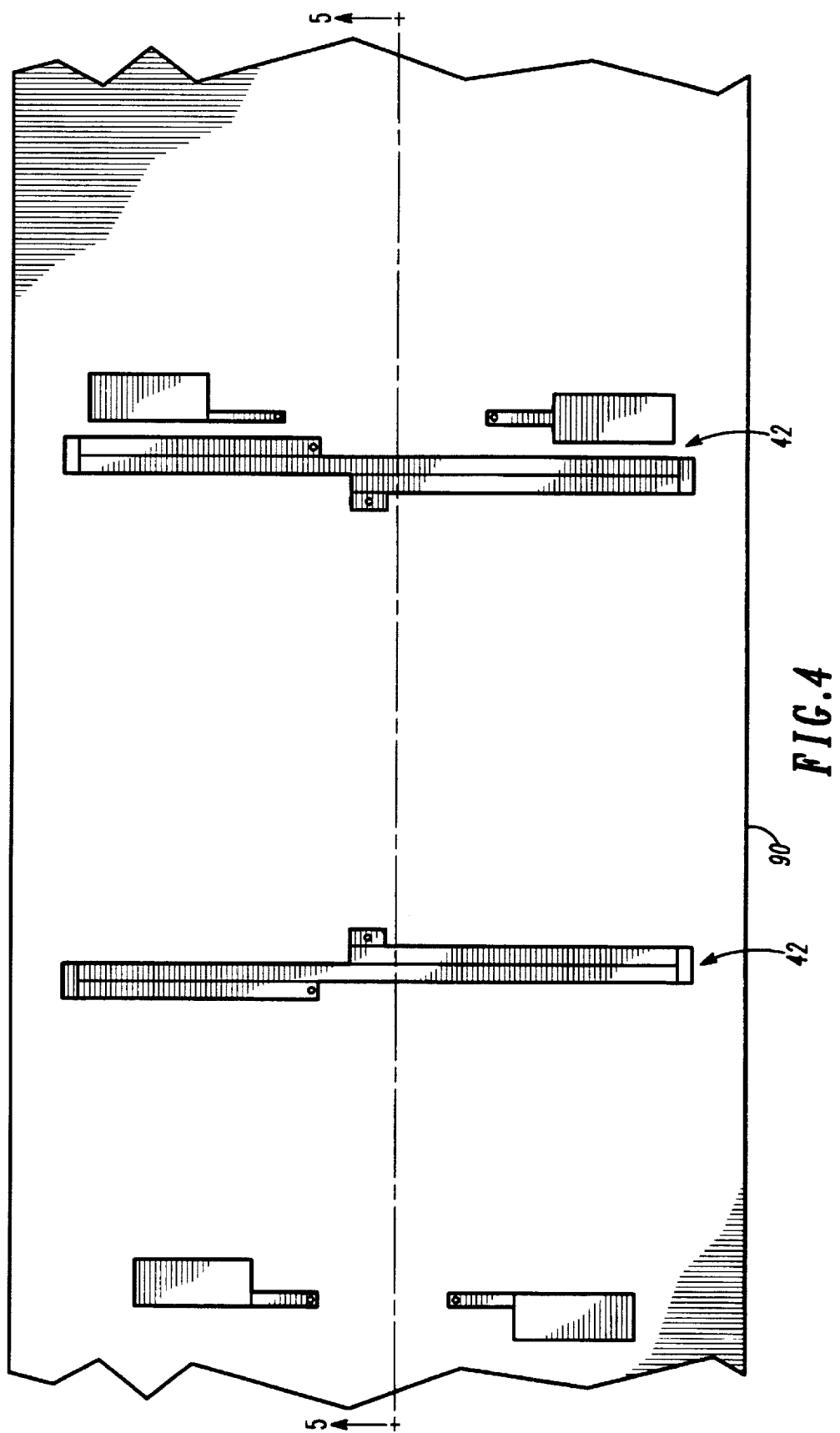
FIG. 4 is a top view of an electronic device according to a further embodiment of the present invention.
Figure 5:
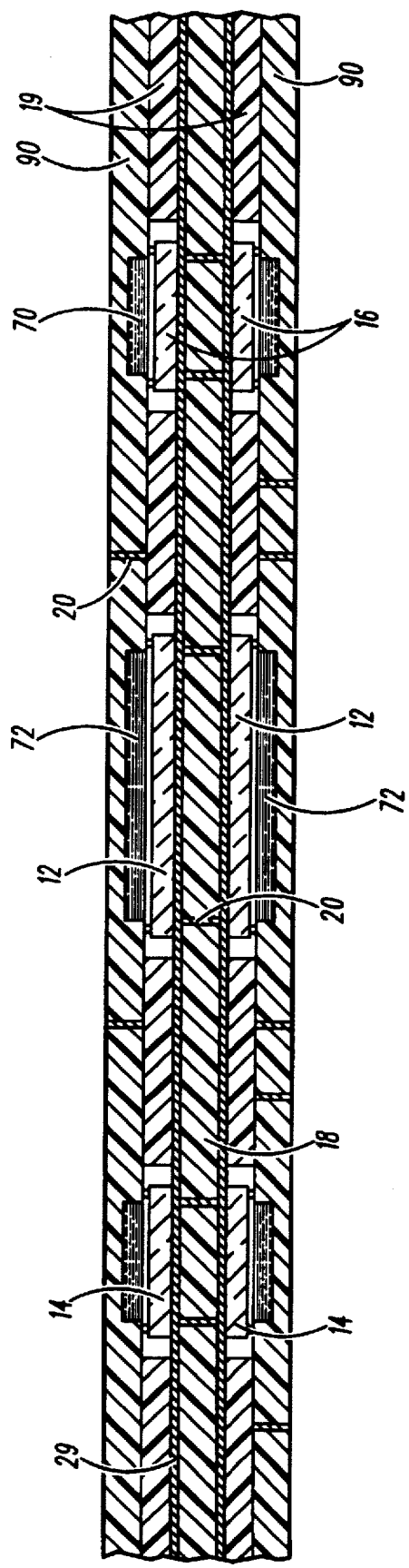
FIG. 5 is a front view along line 5—5 of the electronic device depicted in FIG. 4.

FIG. 4 is a top view of an electronic device according to a further embodiment of the present invention, and FIG. 5 is a front view along line 5—5 of the electronic device depicted in FIG. 4. Electronic devices 10 are disposed on both sides of substrate 18 as described in connection with FIG. 3. Rather than securing devices 10 to substrates 19 using interconnects 44, however, further substrate layers 90 having fluid distributing channels 72 therein are coupled to substrates 19. Dice 12, 14 and 16 are disposed within fluid distributing channels 72. Inductive metal regions 42 are located on substrate layers 90. Communication between inductive metal regions 42 and dice 12, 14 and 16 may be effected by vias 20. The electronic device depicted in FIGS. 4 and 5 is a compact, three-dimensional transistor matrix which accommodates spray-cooling as described herein through fluid distributing channels 72 and is physically robust.

It is contemplated that any form of cooling may be utilized with the electronic device of the present invention, for example, air cooling and/or heat sinks and other types of cooling.

It is also contemplated that wherever sealing and/or fastening may be required, numerous methods and materials may be used such as soldering, adhesives or fired ceramic.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An electronic device, comprising:
   a substrate;
   a first semiconductor die disposed on the substrate, the first semiconductor die having a major surface, at least a portion of the major surface is positioned to receive a cooling medium;
   a signal input region, an active region and a conductive region disposed on the major surface, the conductive region electrically coupling the signal input region and the active region; and
   an electrically reactive metal region in communication with the signal input region, sized to allow real-time iterative tuning of the electronic device.

2. The electronic device according to claim 1, further comprising:
   a second semiconductor die in communication with the electrically reactive metal region.

3. The electronic device according to claim 2, wherein the second semiconductor die comprises a capacitor.

4. The electronic device according to claim 1, further comprising:
   a flexible member in communication with the first semiconductor die and the substrate.

5. The electronic device according to claim 4, wherein the flexible member is "S"-shaped.

6. The electronic device according to claim 4, wherein the flexible member is flat.

7. The electronic device according to claim 1, wherein the substrate comprises ceramic.

8. The electronic device according to claim 1, wherein the active region is ballasted to balance a current flow through the active region.

9. The electronic device according to claim 1, wherein the electrically reactive metal region is sized to allow laser tuning of the electronic device.

10. The electronic device according to claim 1, wherein the first semiconductor die comprises a radio frequency transistor.

11. An electronic device, comprising:
    a first substrate layer having a first top side and a first bottom side;
    a first radio frequency component disposed on the first top side, the first radio frequency component having a first major surface, a first signal input region and a first active region being disposed on the first major surface;
    a second substrate layer having a second top side and a second bottom side, at least a portion of the first radio frequency component coupled to the second bottom side, the second bottom side having a first fluid distributing channel disposed therein, the first fluid distributing channel in communication with at least a portion of the first major surface; and
    a first inductive metal region disposed on the second top side, the first inductive metal region in communication with the first signal input region, sized to allow real-time iterative tuning of the first radio frequency component.

12. The electronic device according to claim 11, further comprising:
    a second radio frequency component disposed on the first bottom side, the second radio frequency component having a second major surface, a second signal input region and a second active region being disposed on the second major surface.

13. The electronic device according to claim 12, further comprising:
    a third substrate layer having a third top side and a third bottom side, at least a portion of the second radio frequency component coupled to the third top side, the third top side having a second fluid distributing channel disposed therein, the second fluid distributing channel in communication with at least a portion of the second major surface.

14. The electronic device according to claim 13, further comprising:

a second inductive metal region disposed on the third bottom side, the second inductive metal region in communication with the second signal input region.

sized to allow real-time iterative tuning of the second radio frequency component.

15. The electronic device according to claim 11, wherein the first fluid distributing channel is sized to receive an atomized dielectric fluid.

* * * * *